(12) United States Patent
Mitlehner et al.

(10) Patent No.: US 6,388,271 B1
(45) Date of Patent: May 14, 2002

(54) SEMICONDUCTOR COMPONENT

(75) Inventors: Heinz Mitlehner, Uttenreuth; Michael Stoisiek, Ottobrunn, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/523,232

(22) Filed: Mar. 10, 2000

Related U.S. Application Data

(63) Continuation of application No. PCT/DE98/02625, filed on Sep. 7, 1998.

Foreign Application Priority Data

Sep. 10, 1997 (DE) .......................................... 197 39 813
Sep. 23, 1997 (DE) .......................................... 197 41 928

(51) Int. Cl.[7] .......................................... H01L 31/0312
(52) U.S. Cl. .......................... 257/77; 257/343; 257/409; 257/492
(58) Field of Search .......................... 257/77, 343, 409, 257/492

(56) References Cited

U.S. PATENT DOCUMENTS

| | | |
|---|---|---|
| 5,378,912 A | 1/1995 | Pein |
| 5,438,220 A | 8/1995 | Nakagawa et al. |
| 5,510,275 A | 4/1996 | Malhi |
| 5,734,180 A * | 3/1998 | Malhi |

FOREIGN PATENT DOCUMENTS

| | | |
|---|---|---|
| EP | 0 144 654 | 6/1985 |
| EP | 0 735 589 A3 | 10/1996 |
| FR | 80 04965 | 12/1980 |
| JP | 63002382 | 1/1988 |

* cited by examiner

*Primary Examiner*—Eddie Lee
*Assistant Examiner*—José R Díaz
(74) *Attorney, Agent, or Firm*—Herbert L. Lerner; Laurence A. Greenberg; Werner H. Stemer

(57) ABSTRACT

The power semiconductor components in prior art high-voltage smart power ICs frequently take up more than half of the total chip surface. To be able to produce the ICs more economically, the material consumption must be reduced, and hence, in particular, the surfaces of the drift zones of the power semiconductor components must be made significantly smaller. Based on the premise that the electrical breakdown field strength of silicon carbide is approximately ten times higher than that of silicon, the parts of a semiconductor component which receive voltage are integrated in silicon carbide. The drift zone can be made much smaller for the same reverse voltage. In an SiC MOS transistor with lateral current conduction, the SiC layer, which is only approximately 1–2 $\mu$m thick and is covered by an $SiO_2$ layer, is arranged so as to be dielectrically insulated on an Si substrate. Two $n^+$-doped SiC regions are used as source and drain contacts. The electron-conducting channel is formed on that surface of a $p^+$-doped region of the SiC layer which is opposite the gate electrode. The SiC drift zone, which is only weakly electron-conducting, adjoins the channel in the lateral direction.

4 Claims, 4 Drawing Sheets

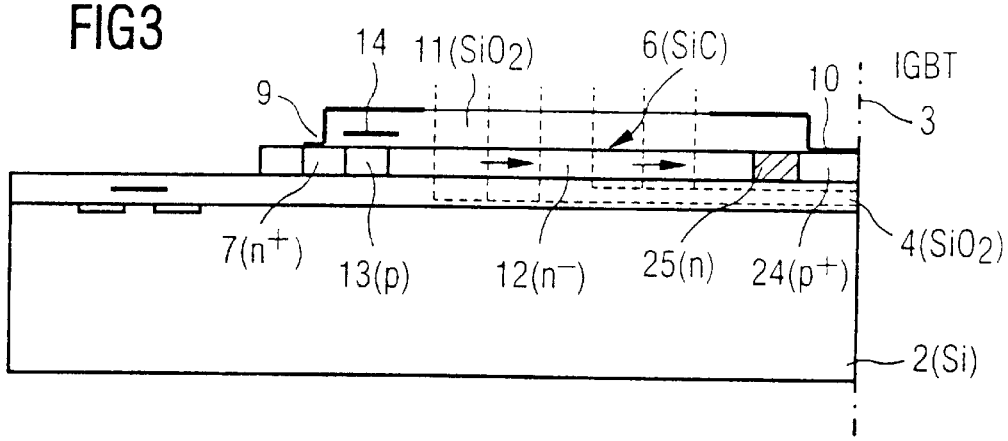
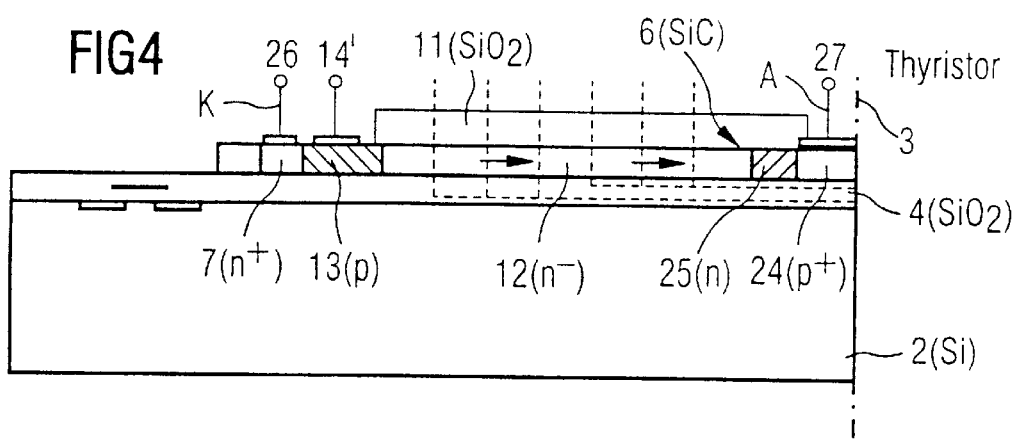
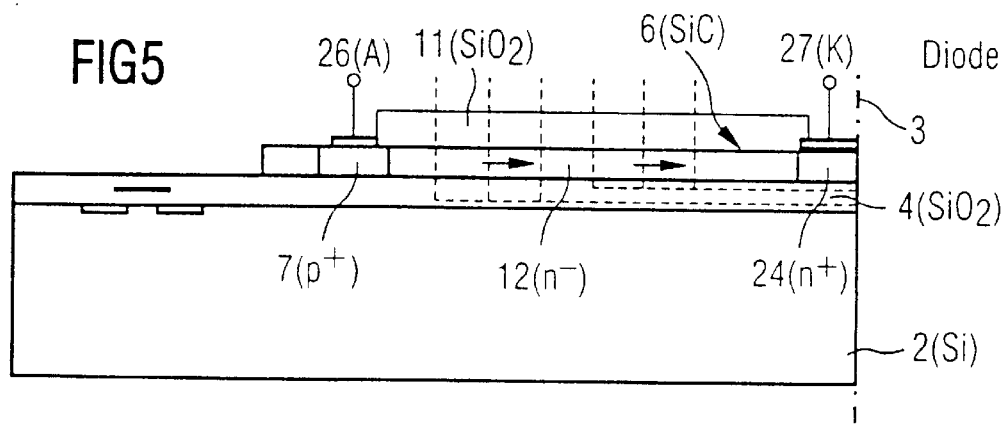

SEMICONDUCTOR COMPONENT

CROSS-REFERENCE TO RELATED APPLICATION

This is a continuation of copending International Application PCT/DE98/02625, filed Sep. 7, 1998, which designated the United States.

BACKGROUND OF THE INVENTION

1. Field of the Invention

The invention lies in the field of semiconductor technology and pertains, in particular, to a semiconductor component with a drift zone that conducts current in the lateral direction.

One of the most important market segments for smart power ICs is motor drives. Such control drives use, among other things, so-called half-bridge inverters. Due to the fact that these inverters need to be designed for voltages of a few 100 volts, IGBTs (Insulated Gate Bipolar Transistor) with lateral current conduction are generally used as switching elements. Despite their comparatively compact design, the IGBTs take up significantly more than half of the total chip surface of the respective half-bridge inverter (see, for example, M. Stoisiek et al., "A Dielectric Isolated High-Voltage IC-Technology For Off-Line Applications", Proc. 1995 Int. Symposium on Power Semiconductor Devices & IC's, Yokohama (1995), pp. 325–329; FIG. 8). To be able to produce half-bridge inverters and other high-voltage smart power ICs (reverse voltage $V_{br}$>200–600 volts) more economically, the material costs need to be reduced, and hence, in particular, the surfaces of the drift zones of the power semiconductor components of the IC need to be significantly reduced.

By using the so-called resurf principle (reduced surface field principle)—see Appels and Vaes, "High Voltage Thin Layer Devices (Resurf Devices)," IEDM Tech. Dig., 1979, p. 238—the distribution of the electrical field on the surface of a semiconductor component can be influenced in a targeted fashion. This technique allows the production of compactly designed components with a high blocking capability and with comparatively thin semiconductor layers receiving the field.

2. Brief Summary of the Invention

The object of the invention is to provide a semiconductor component that conducts current in the lateral direction which overcomes the above-noted deficiencies and disadvantages of the prior art devices and methods of this kind, and the drift zone of which, irrespective of whether it is designed as an MOS transistor, an IGBT, a thyristor or a diode, should take up a much smaller surface at a predetermined reverse voltage than the drift zone of the corresponding component known from the prior art.

With the above and other objects in view there is provided, in accordance with the invention, a semiconductor component, comprising:

a substrate formed of a first semiconductor material having a given electrical breakdown field strength and carrying a first insulator layer having a surface;

a second layer covering at least a part of the surface of the first insulator layer, the second layer being formed of a second semiconductor material having an electrical breakdown field strength higher than the given electrical breakdown field strength of the first semiconductor material;

the second layer having a first region in contact with a first electrode and doped to be electrically conductive, and a second region in contact with a second electrode and doped to be electrically conductive, the second layer extending in a first lateral direction so as to form a drift zone between the first region and the second region;

a second insulator layer doped to be electrically conductive and covering the drift zone; and a control element conductively connected to one of the first and second electrodes and arranged in a portion of the substrate not covered by the second layer.

In accordance with an added feature of the invention, the control element is a MOS structure.

In accordance with an additional feature of the invention, the first region has a multiplicity of subregions of a corresponding conductivity type, the subregions are spaced apart from one another in a second lateral direction orthogonal to the first lateral direction, adjacent subregions are insulated from one another by contact regions of an opposite conductivity type, the control element has a first connection conductively connected to each of the subregions and a second connection conductively connected to each of the contact regions.

In accordance with another feature of the invention, the first and second electrodes are each a comb-shaped electrode making contact with the subregions and the contact regions, respectively.

In accordance with a concomitant feature of the invention, a product of a doping (in $cm^{-3}$) and of a thickness (in cm) of the second layer in a region of the drift zone is between $10^{13}$ $cm^{-2}$ and $5 \cdot 10^{13}$ $cm^{-2}$.

The invention permits smart power ICs, for example, to be produced much more economically on account of the significantly smaller surface of the power semiconductor components, or permits a larger number of components with the same blocking ability to be integrated on a smaller chip surface.

Other features which are considered as characteristic for the invention are set forth in the appended claims.

Although the invention is illustrated and described herein as embodied in a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a sectional view of an exemplary embodiment of an IGBT;

FIG. 4 is a sectional view of an exemplary embodiment of a thyristor;

FIG. 5 is a sectional view of an exemplary embodiment of a diode; and

DETAILED DESCRIPTION OF THE DRAWING

Figure 1:
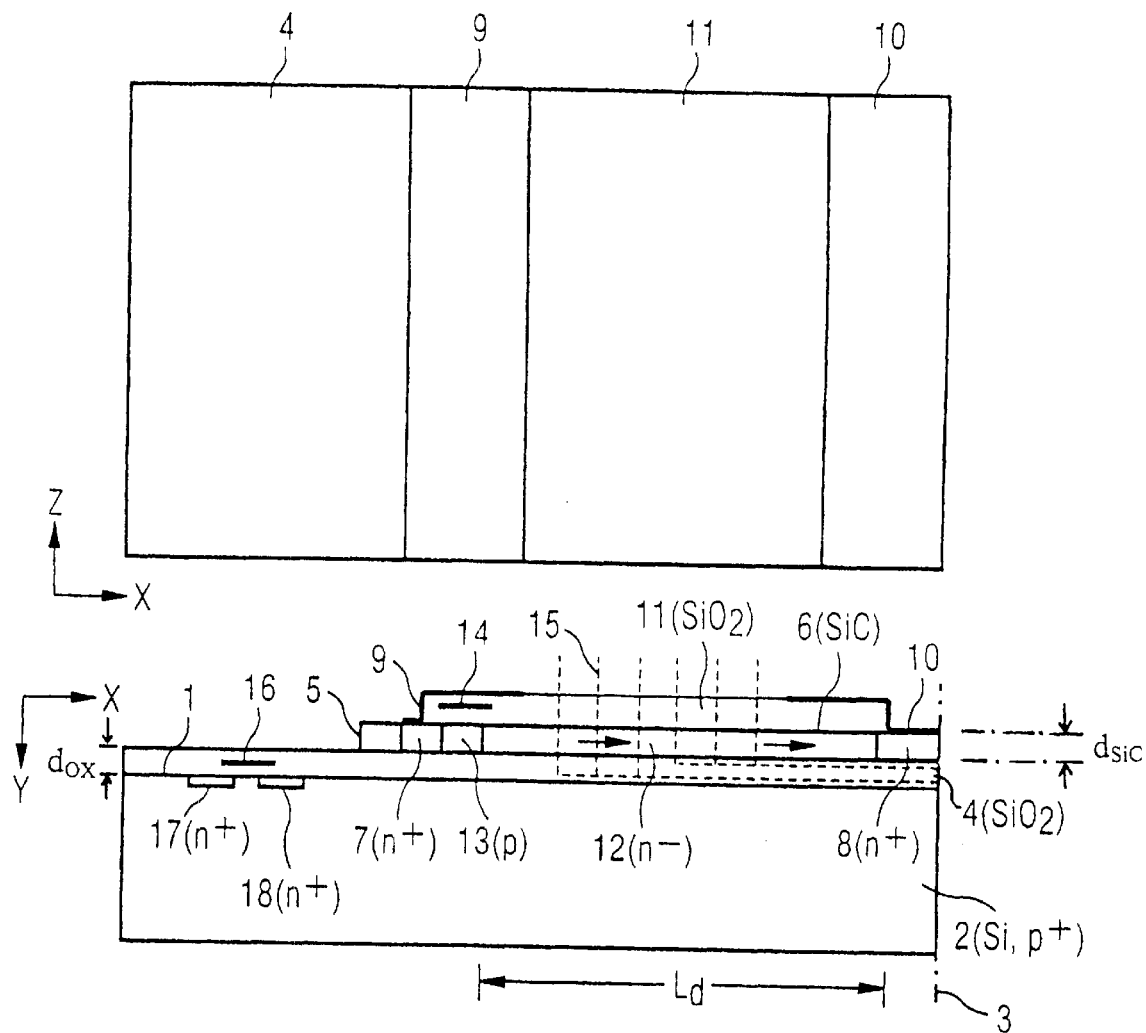
FIG. 1 is a plan view and a sectional view of a first exemplary embodiment of an SiC MOS transistor according to the invention.

Referring now to the figures of the drawing in detail there are shown various exemplary embodiments of the invention, as described in the following:

FIRST EXAMPLE
SiC MOS Transistor

The SiC MOS transistor shown in FIG. 1 (not drawn to scale) is of mirror-image symmetrical design about the axis 3 which is perpendicular to a main surface 1 of a substrate 2. The substrate of the exemplary embodiment is a $p^+$-doped silicon substrate (dopant concentration$>10^{18}$–$10^{19}$ cm$^{-3}$) that carries a thermally grown, typically 1–3 μm thick $SiO_2$ layer 4 dielectrically insulating the MOS transistor, which conducts current in the lateral direction, from the $p^+$-doped Si substrate 2. An SiC layer 6 partially covers the $SiO_2$ layer 4 and is bounded at the edge by an $SiO_2$ zone 5. A thickness $d_{sic}$ of the SiC layer 6 is $d_{sic} \leq 1$–$2$ μm, for example. The SiC layer 6 has two $n^+$-doped regions 7 and 8 (dopant concentration$>10^{18}$ cm$^{-3}$), with a source electrode 9 making contact with the outer region 7, and a drain electrode 10 making contact with the inner region 8. Between the source-side region 7 and the drift zone 12, which is only weakly electron conducting and is covered by an $SiO_2$ insulator layer 11 ("intermediate oxide"), there is a $p^+$-doped region 13 (doping$\approx 10^{17}$ cm$^{-3}$). Associated with this region is the gate electrode 14, which is embedded in the insulator layer 11 and is connected to interconnect connections via contact holes. The gate electrode 14, which is made of polycrystalline silicon, for example, covers both the $p^+$-doped region 13 and part of the adjoining drift zone 12. If a positive potential is applied to the gate electrode 14, the p-conducting region 13 is depleted. At the same time, an n-conducting channel forms at the gate-side surface of said p-conducting region, and the electrons flow through this n-conducting channel from the source electrode 9 into the drift zone 12 and on to the drain electrode 10 as soon as the potential difference which has built up between the source and drain electrodes 9/10 exceeds the threshold voltage specific to the component. In the region of the drift zone 12, the current thus flows through the SiC MOS transistor in the lateral direction indicated by the arrows.

The dotted lines 15 shown in the bottom part of FIG. 1 mark locations of equal potential within the reverse-biased SiC MOS transistor. Since the source electrode 9 and the substrate 2 are at the same potential, the equipotential lines 15 in the $SiO_2$ layer 4 run approximately parallel to the main surface 1 of the substrate 2. The highest electrical load is borne by that region of the $SiO_2$ layer 4 which is directly below the drain electrode 10. If another electrical field strength of $E_{max}$ ($SiO_2$)$\approx$2 MV/cm=200 V/μm is allowed to exist in this region of the $SiO_2$ layer 4, which is $d_{ox}$=3 μm thick, for example, the reverse voltage can be a maximum of $V_{br}$=600 V.

Owing to the electrical breakdown field strength of the SiC being approximately 10 times higher than that of silicon, the width $L_d$ of the drift zone 12 receiving the reverse voltage $V_{br}$=600 volts, is, at $L_d<3$ μm, markedly below the value ($L_d$(Si)$\approx V_{br}/E_{br}$ (Si)=30 μm; $E_{br}$(Si)=2·10$^5$ V/cm:= electrical breakdown field strength Si) required in an equivalent Si MOS transistor. The doping of the drift zone 12 is chosen such that the product $N_D \cdot d_{SiC}$ ($N_D$=dopant concentration, $d_{SiC}$=thickness of the SiC layer 6) is at least approximately equivalent to the value $N_D \cdot d_{SiC} \approx 3 \times 10^{13}$ cm$^{-2}$. This ensures that the drift zone 12 is depleted of charge carriers very quickly, and the electrical field strength is approximately constant over the entire width $L_d$ of the drift zone 12 when the SiC MOS transistor is turned off.

As indicated in FIG. 1, the further components present in a high-voltage smart power IC can be integrated in that region of the Si substrate 2 which is not covered by the SiC layer 6, and can be connected to one another and to the connections of the SiC MOS transistor via interconnect metallizations. The component shown in the left-hand part is a conventional Si MOS transistor with a gate electrode 16 embedded in the $SiO_2$ layer 4 and two $n^+$-doped regions 17/18 which are spaced apart from one another in the substrate 2.

SECOND EXAMPLE
SiC MOS Transistor

Figure 2:
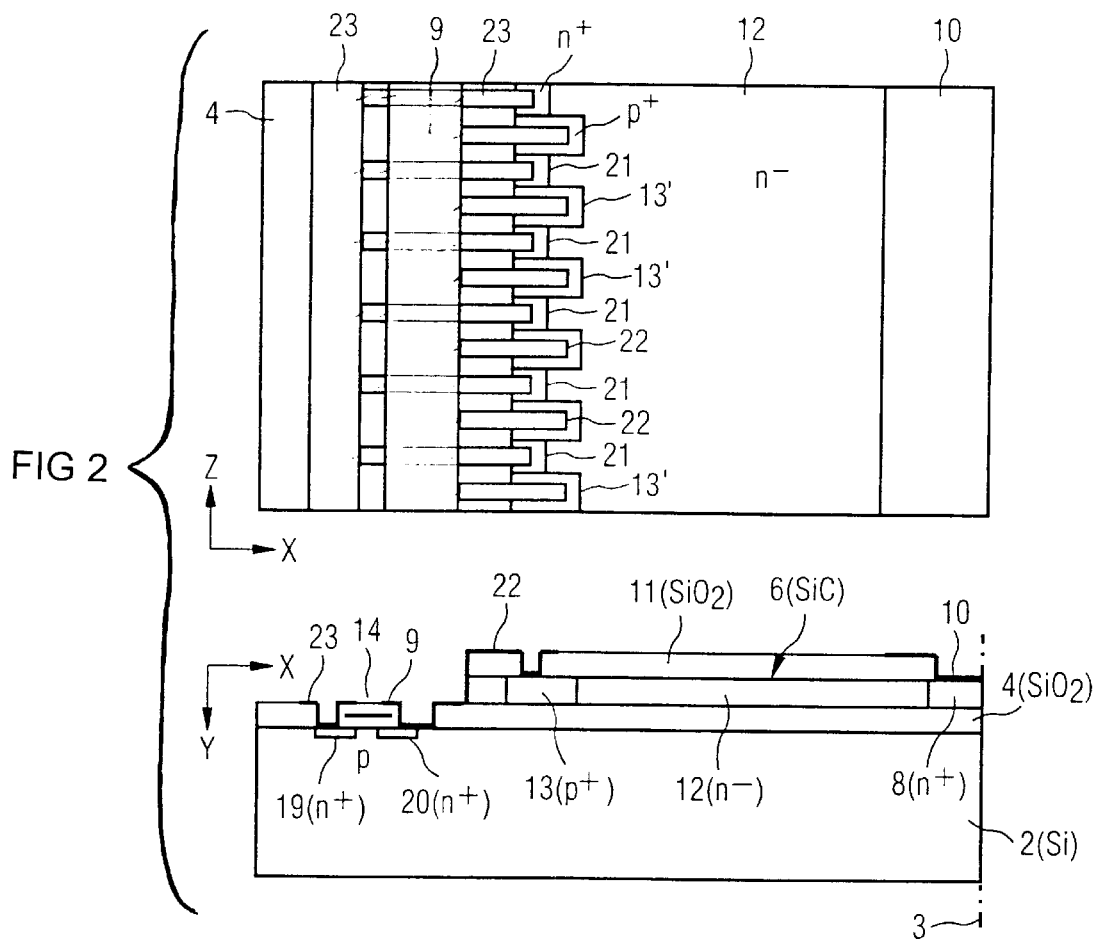
FIG. 2 is a plan view and a sectional view of a second exemplary embodiment of an SiC MOS transistor.

Electrons have a significantly lower mobility in SiC than in silicon, which has a disadvantageous effect on the turn-on resistance of the corresponding SiC component. Since, in particular, MOS transistors with a high blocking capability should have as small a turn-on resistance as possible, it is proposed that only the part of the transistor which receives voltage be produced in SiC, while the gate-controlled channel region is produced in Si. FIG. 2 shows a plan view and a cross section of the equivalent component, comprising an Si MOSFET and an SiC drift path.

The component has a finger-shaped layout in the z-x plane and it is mirror-symmetrical relative to the axis 3. Depending on the potential of the gate electrode 14 embedded in the $SiO_2$ layer 4, the electron-conducting channel forms at the surface of the p-conducting Si substrate 2 between the two $n^+$-doped regions 19/20. The source electrode 9, which is in contact with the region 20, is conductively connected to the p-doped, source-side region 13 of the SiC layer 6, which is arranged so as to be dielectrically insulated on the substrate 2, with the source electrode 9 forming the first main current contact of the component at the same time. In the lateral direction, the source-side region 13 is adjoined by the weakly electronconducting SiC drift zone 12, which receives the reverse voltage, and by the $p^+$-doped SiC region 8, which is in contact with the drain electrode 10. In this instance, the drain electrode 10 forms the second main current contact of the component.

As shown schematically in the plan view, the source-side region 13 of the SiC layer 6 comprises a multiplicity of $p^+$-doped subregions 13' arranged spaced apart from one another in the z direction, with an $n^+$-doped SiC connection region 21 (dopant concentration$\approx 10^{18}$–$10^{19}$ cm$^{-3}$) being arranged between adjacent subregions 13'. Whereas the $p^+$-doped subregions 13' are connected to the source electrode 9 by means of a comb-shaped interconnect system 22, the $n^+$-doped connection regions 21 have contact made by the comb-electrode 23 associated with the region 19 of the Si MOS transistor.

Exemplary Embodiments: IGBT, Thyristor, Diode

The IGBT shown in cross section in FIG. 3, which is also mirror-symmetrical about the axis 3, differs from the SiC MOS transistor described in the first example above essentially only in that the drain electrode 10 is in contact with a $p^+$-doped region 24 (dopant concentration$\approx 10^{18}$–$10^{19}$ cm$^{-3}$) of the SiC layer 6, and this region 24 has an n-doped region 25 (dopant concentration$\approx 10^{16}$–$10^{17}$ cm$^{-3}$) upstream which serves as an anti-punch zone. When forward-biased, the electrons flow away from the source electrode 9 into the $n^+$-doped region 7, through the channel forming at the gate-side surface of the p-doped region 13, into the weakly electron-conducting SiC drift zone 12, and, in the direction of the arrows, on to the n-doped region 25, the p-doped region 24 and, finally, via the drain electrode 10. The gate electrode 14 is again embedded in the $SiO_2$ layer 11 covering the drift zone 12 and is arranged above the source-side, p⁺-doped region 13. The substrate 2 provided with an SiO₂ layer 4 is made of p⁺-doped silicon.

As in the case of the SiC MOS transistor, the IGBT can also have only the voltage-receiving part produced in SiC, while the gate-controlled channel region is produced in Si (not shown, cf. FIG. 2).

In the thyristor shown in cross section in FIG. 4, the SiC layer 6 arranged on the SiO₂ layer 4 of the p⁺-doped SiO₂ has, in the lateral direction, the same series of regions 7/13/12/25/24 of different conductivity as the SiC layer 6 in the IGBT described above, with an SiO₂ layer 11 again covering the weakly electron-conducting drift zone 12, which is arranged between a p-doped region 13, which is in contact with a gate electrode 14', and the n-doped region 25. The n⁺-doped region 7 is provided with a metallization 26 serving as a cathode, and the p⁺-doped region 24 is provided with an anode metallization 27.

The simplest design of the semiconductor components according to the invention is that of the SiC diode shown in cross section in FIG. 5. It essentially consists of a p⁺-doped Si substrate 2 provided with SiO₂ passivation 4, an SiC layer 6 arranged on the SiO² layer 4, and an SiO² layer 11 partially covering the SiC layer 6. The weakly electron-conducting SiC drift zone 12 receiving the field is arranged between an n⁺-doped region 24, provided with a cathode metallization 27, and a p⁺-doped region 7, which is provided with an anode metallization 26.

Method of Producing an SiC MOS Transistor

The method (explained with reference to FIGS. 6A–6D) for producing the MOS transistor shown in FIG. 1 starts with a p⁺-doped Si substrate 2, which is provided with a thermally grown SiO₂ layer 4, and an Si substrate 28, which has a (1 0 0) orientation, for example, and on whose surface an approximately 1–2 $\mu$m thick SiC layer 6 has been deposited from the vapor phase under atmospheric pressure. A particularly suitable deposition process is described, for example, by C. A. Zorman et al., "Epitaxial growth of 3C-SiC films on 4 in. diam. (100) silicon wafers by atmospheric pressure chemical vapor deposition," J. Appl. Phys. 78 (8), 1995, pp. 5136–38.

Figure 6A:
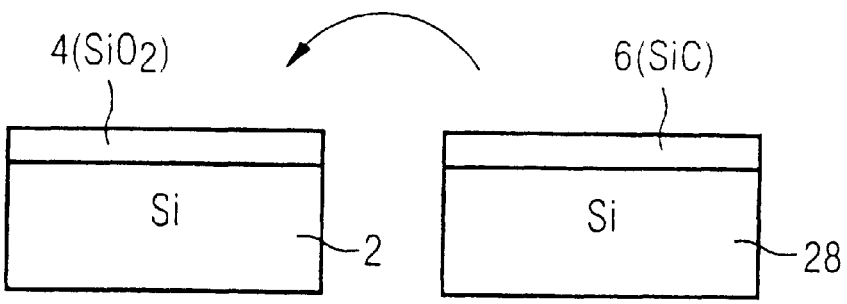
FIGS. 6A–6D are various sectional views of semiconductor structure showing a sequence of the individual steps of a method for producing the SiC MOS transistor of FIG. 1.
Figure 6B:
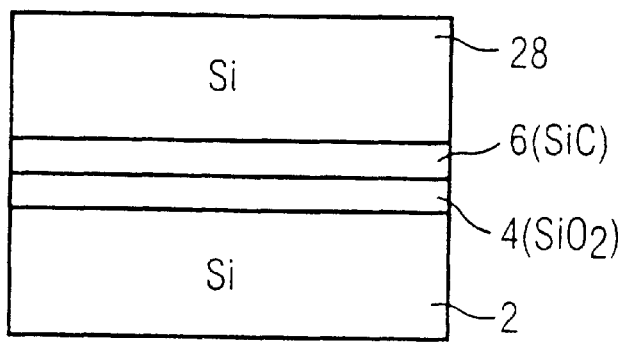
Figure 6C:
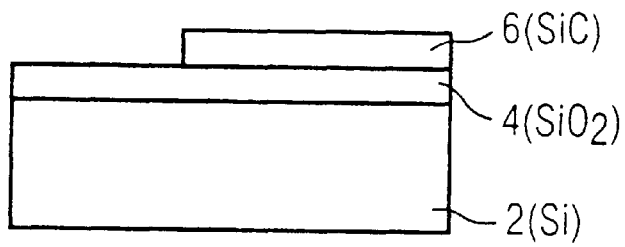
Figure 6D:
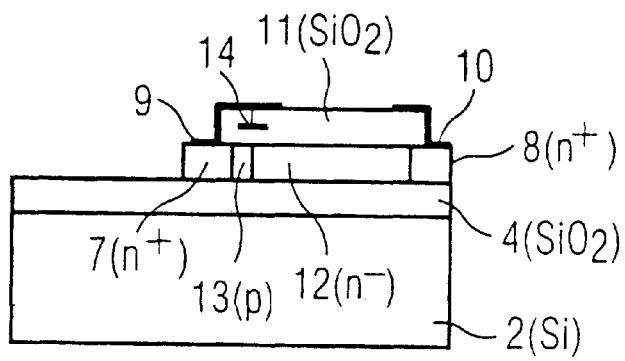

The two substrates 2 and 28 are connected to one another (direct wafer bonding) such that the SiC layer 6 comes to bear against the SiO₂ passivation 4 of the highly doped substrate 2 (see FIG. 6B). Next, the Si used as substrate material for the SiC is completely removed using a series of grinding, lapping and etching steps. When a dry etching step has been carried out, the semiconductor body shown in FIG. 6C is obtained, whose SiC layer 6 has a structure corresponding to the SiO₂ etching mask used. The necessary n⁺, p and p⁺ implantation operations for defining the source and drain regions 7/13/8 are then carried out (see FIG. 6D), the MOS gate oxide and the gate electrode 14 are produced, an intermediate oxide 11 is applied, contact holes are etched and the interconnect/electrode metallizations 9/10 are applied and structured. For additional information in this context, see the section "Process Flow" in the above-quoted article by Stoisiek et al., "A Dielectric Isolated High-Voltage IC-Technology For Off-Line Applications" (p. 1, supra).

The semiconductor components shown in FIGS. 2 to 5 can also be produced in an equivalent manner, in which case the SiC can also be replaced, for example, by GaAs, which has a high electrical breakdown field strength.

We claim:

1. Semiconductor component, comprising:

a substrate formed of a first semiconductor material having a given electrical breakdown field strength and carrying a first insulator layer having a surface;

a second layer covering at least a part of said surface of said first insulator layer, said second layer being formed of a second semiconductor material having an electrical breakdown field strength higher than the given electrical breakdown field strength of said first semiconductor material;

said second layer having a first region in contact with a first electrode and doped to be electrically conductive, and a second region in contact with a second electrode and doped to be electrically conductive, said second layer extending in a first lateral direction so as to form a drift zone between said first region and said second region, said first region having a multiplicity of subregions of a corresponding conductivity type, said subregions being spaced apart from one another in a second lateral direction orthogonal to the first lateral direction;

a second insulator layer covering said drift zone;

a control element having a first connection and a second connection, said control element conductively connected to one of said first and second electrodes and arranged in a portion of said substrate not covered by said second layer; and contact regions of an opposite conductivity than said subregions insulating adjacent said subregions from one another, each of said subregions conductively connected to said first connection of said control element, and each of said contact regions conductively connected to said second connection of said control element.

2. The semiconductor component according to claim 1, wherein said control element is a MOS structure.

3. The semiconductor component according to claim 2, wherein said first and second electrodes are each a comb-shaped electrode making contact with said subregions and said contact regions, respectively.

4. The semiconductor component according to claim 1, wherein a product of a doping and of a thickness of said second layer in a region of said drift zone is between $10^{13}$ cm⁻² and $5 \cdot 10^{13}$ cm⁻².

\* \* \* \* \*